(12) United States Patent
Wilson et al.

(10) Patent No.: US 7,995,411 B2
(45) Date of Patent: *Aug. 9, 2011

(54) SENSING AND LATCHING CIRCUIT FOR MEMORY ARRAYS

(75) Inventors: James Wilson, Maple Valley, WA (US); Gregg Hoyer, Enumclaw, WA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/802,476

(22) Filed: Jun. 7, 2010

(65) Prior Publication Data

US 2010/0246281 A1  Sep. 30, 2010

Related U.S. Application Data

(63) Continuation of application No. 12/009,566, filed on Jan. 18, 2008, now Pat. No. 7,760,568.

(51) Int. Cl.
*G11C 11/00* (2006.01)

(52) U.S. Cl. ........................................ 365/207; 365/205

(58) Field of Classification Search .................. 365/207, 365/205

See application file for complete search history.

(56) References Cited

U.S. PATENT DOCUMENTS 5,517,462 A * 5/1996 Iwamoto et al. .............. 365/195

* cited by examiner

*Primary Examiner* — Michael T Tran

(74) *Attorney, Agent, or Firm* — Farjami & Farjami LLP

(57) ABSTRACT

According to one exemplary embodiment, a memory sensing and latching circuit includes a sensing circuit for evaluating bit lines in a memory array and providing a sensed output. The memory sensing and latching circuit further includes a latching circuit including a dynamic one-shot circuit driven by the sensed output, a sense amplifier enable signal, and a precharge clock. The latching circuit further includes a storage circuit for storing a one-shot output of the dynamic one-shot circuit, where the one-shot output corresponds to the sensed output. The one-shot output of the dynamic one-shot circuit is stored in the storage circuit during an evaluation of the sensed output. The evaluation of the sensed output is responsive to the sense amplifier enable signal.

20 Claims, 3 Drawing Sheets

SENSING AND LATCHING CIRCUIT FOR MEMORY ARRAYS

This is a continuation of application Ser. No. 12/009,566 filed Jan. 18, 2008 now U.S. Pat. No. 7,760,568.

BACKGROUND OF THE INVENTION

1. Field of The Invention

The present invention is generally in the field of electrical circuits. More specifically, the present invention is in the field of memory sensing and latching circuits.

2. Background Art

A continuing problem facing manufacturers of memory arrays, such as random access memory (RAM) arrays, static random access memory (SRAM) arrays, and content-addressable memory (CAM) arrays, is reducing "memory cycle time," which can be defined as the minimum time interval between starts of successive read/write cycles. In order to minimize memory cycle time, it is important to utilize a fast sense amplifier, such as a "drain-fed" sense amplifier, to sense, amplify, and output data on bit lines in a memory array. The expression "drain-fed" refers to the coupling of the bit lines to the drains of the transistors that typically form a pair of cross-coupled inverters in the drain fed sense amplifier.

In a sense amplifier, such as a drain-fed sense amplifier, the output of the sense amplifier is driven by the input of the sense amplifier, which is coupled to bit lines of the memory array. However, the bit lines that are coupled to the sense amplifier cannot be precharged until the output of the sense amplifier has been stored in a latching circuit. A conventional latching circuit can include a pair of cross-coupled inverters, which are coupled to the output of the sense amplifier. As a result, the output of the sense amplifier has to be held in its selected state for a long duration to allow the conventional latching circuit to store the output of the sense amplifier, which can undesirably increase memory cycle time. Also, a large-size output buffer is typically required to drive a conventional latching circuit, which can undesirably increases the area consumed by the sense amplifier and its output buffer, and also imposes additional capacitive loading on the bit lines.

SUMMARY OF THE INVENTION

A memory sensing and latching circuit substantially as shown in and/or described in connection with at least one of the figures, as set forth more completely in the claims.

DETAILED DESCRIPTION OF THE INVENTION

The present invention is directed to a memory sensing and latching circuit. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
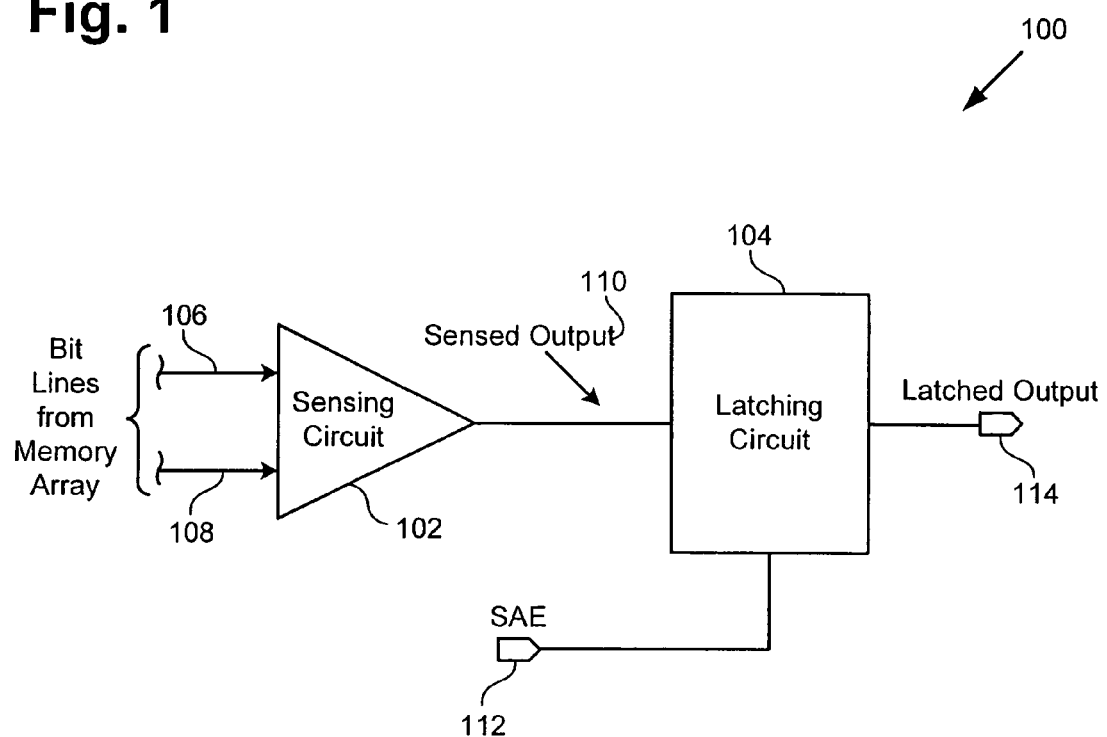
FIG. 1 shows a block diagram of an exemplary memory sensing and latching circuit in accordance with one embodiment of the present invention.

FIG. 1 shows a block diagram of memory sensing and latching circuit 100 in accordance with one embodiment of the present invention. Memory sensing and latching circuit 100 includes sensing circuit 102 and latching circuit 104. Memory sensing and latching circuit 100 can be coupled to a DRAM, an SRAM, or a CAM memory array, or other suitable type of memory array. As shown in FIG. 1, bit lines 106 and 108 are coupled to the input of sensing circuit 102. Bit line 106 and bit line 108, which is the complement of bit line 106, are driven by a memory cell (not shown in FIG. 1), such as a dual port memory cell, in a memory array (not shown in FIG. 1), such as, for example, a DRAM, an SRAM, or a CAM array. For example, if bit line 106 has a logic state of "1," bit line 108 will have a logic state of "0," and vice versa. Sensing circuit 102 has differential inputs and can comprise, for example, a drain-fed sense amplifier. In other embodiments, sensing circuit 102 can comprise an analog differential amplifier or other suitable type of amplifier.

Also shown in FIG. 1, sensing circuit 102 provides sensed data output 110 (also referred to simply as "sensed output 110"), which is coupled to an input of latching circuit 104. Sensing circuit 102 can be configured to precharge and evaluate bit lines 106 and 108 and provide sensed output 110. Further shown in FIG. 1, sense amplifier enable signal (SAE) 112 is coupled to an input of latching circuit 104 and latching circuit data output 114 (also referred to simply as "latched output 114") is outputted by latching circuit 104. Latching circuit 104 can comprise a dynamic one-shot circuit and a storage circuit, which are not shown in FIG. 1. Latching circuit 104 be configured to receive SAE 112, sensed output 110, and a precharge clock (not shown in FIG. 1), store a one-shot output of the dynamic one-shot circuit corresponding to sensed output 110 during evaluation of sensed output 110, and provide latched output 114. By utilizing a dynamic one-shot circuit (not shown in FIG. 1), latching circuit 104 can quickly store sensed output 110, thereby advantageously reducing memory cycle time. An embodiment of the invention's memory sensing and latching circuit will be further discussed below in relation to FIG. 2.

Figure 2:
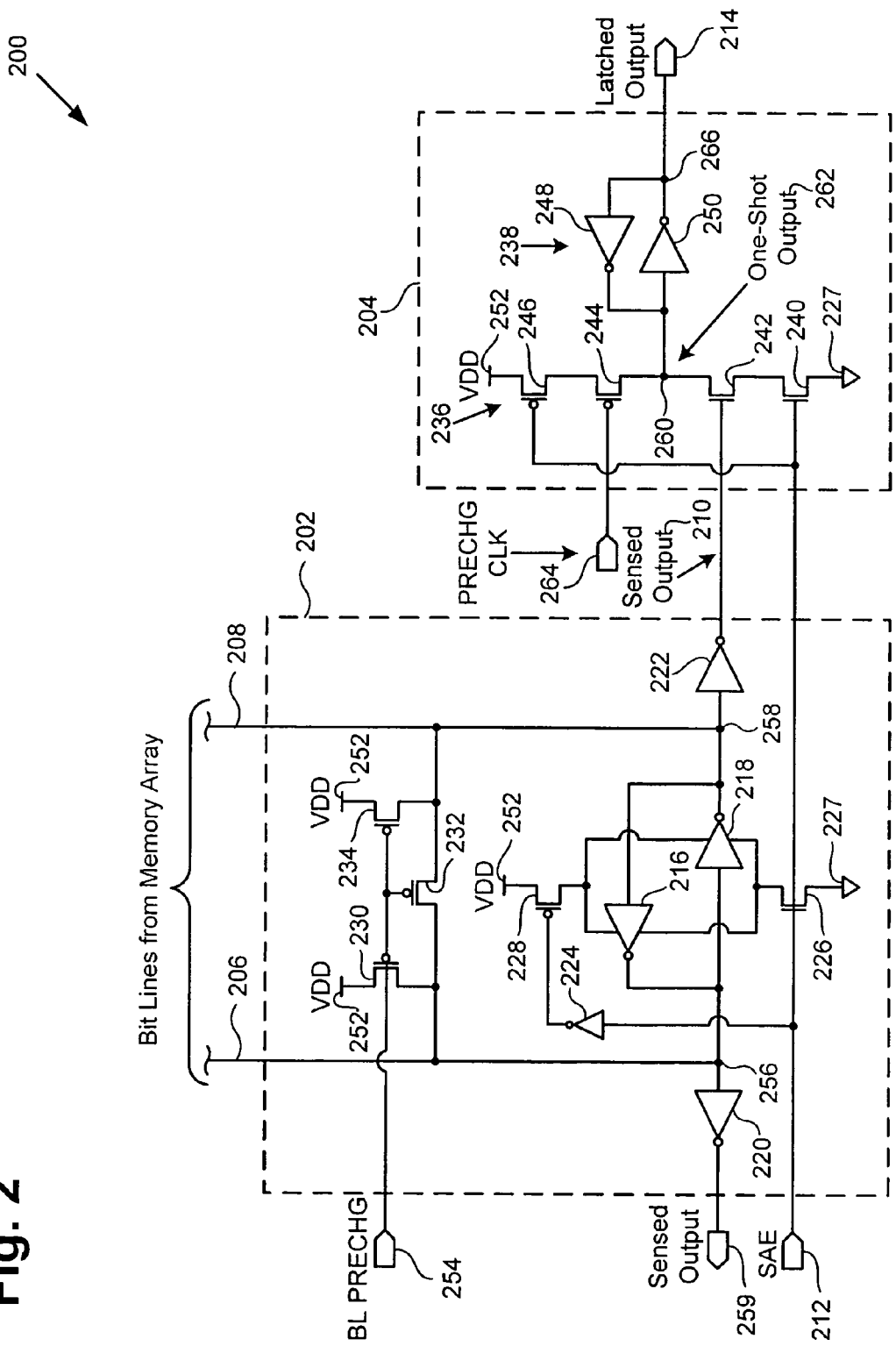
FIG. 2 shows a circuit diagram of an exemplary memory sensing and latching circuit including a dynamic one-shot circuit in accordance with one embodiment of the present invention.

FIG. 2 shows a circuit diagram of memory sensing and latching circuit 200 in accordance with one embodiment of the present invention. In FIG. 2, sensing circuit 202, latching circuit 204, bitlines 206 and 208, sensed output 210, SAE 212, and latched output 214 correspond, respectively, to sensing circuit 102, latching circuit 104, bitlines 106 and 108, sensed output 110, SAE 112, and latched output 114 in FIG. 1. Memory sensing and latching circuit 200 includes sensing circuit 202, which includes inverters 216, 218, 220, 222, and 224, N-channel field effect transistor (NFET) 226, and P-channel field effect transistors (PFETs) 228, 230, 232, and 234, and latching circuit 204, which includes dynamic one-shot circuit 236 and storage circuit 238. Dynamic one-shot circuit 236 includes NFETs 240 and 242 and PFETs 244 and 246 and storage circuit 238 includes inverters 248 and 250. Sensing circuit 202 has differential inputs and can comprise a drain-fed sense amplifier. In other embodiments, sensing circuit 202 can comprise an analog differential amplifier or other suitable type of amplifier.

As shown in FIG. 2, the drains of PFETs 232 and 230 are coupled to bit line 206, the source of PFET 232 and the drain of PFET 234 are coupled to bit line 208, the sources of PFETs 230 and 234 are coupled to supply voltage 252, such as VDD, and bit line precharge signal (BL PRECHG) 254 is coupled to the gates of PFETs 232, 230, and 234. Also shown in FIG. 2, bit line 206 is coupled to the inputs of inverters 220 and 218 at node 256 and the output of inverter 216 and bit line 208 is coupled to the inputs of inverters 222 and 216 and the output of inverter 218 at node 258. Inverters 216 and 218 comprise a pair of drain-fed cross-coupled inverters, which can be configured to sense a small signal differential between bit lines 206 and 208 and to hold the logic state of bit line 206 at node 256 and the logic state of bit line 208 at node 258.

Further shown in FIG. 2, sensed outputs 259 and 210 are provided by sensing circuit 202 at the respective outputs of inverters 220 and 222, where sensed output 259 is the complement of sensed output 210. Also shown in FIG. 2, SAE (sense amplifier enable signal) 212 is coupled to the input of inverter 224 and the gates of NFETs 226 and 240 and the gate of PFET 246, the source of PFET 228 is coupled to VDD, the drain of PFET 228 is coupled to the supply voltage terminals of inverters 216 and 218. Further shown in FIG. 2, the source of NFET 226 is coupled to ground 227 and the drain of NFET 226 is coupled to the ground terminals of inverters 216 and 218.

Also shown in FIG. 2, the source of NFET 240 is coupled to ground 227, the drain of NFET 240 is coupled to the source of NFET 242, and the drains of NFET 242 and PFET 244 are coupled to the input of inverter 250 and the output of inverter 248 at node 260, which also provides the output of dynamic one-shot circuit 236, i.e., one-short output 262. Further shown in FIG. 2, the source of PFET 244 is coupled to the drain of PFET 246 and the source of PFET 246 is coupled to supply voltage 252, such as VDD. Thus, dynamic one-shot circuit 236 comprises four series-coupled FETs, i.e., NFETs 240 and 242 and PFETs 244 and 246. Further shown in FIG. 2, precharge clock (PRECHG CLK) 264 is coupled to the gate of PFET 244, which also provides an input of dynamic one-shot circuit 236 and an input of latching circuit 204. Also shown in FIG. 2, SAE 212 is coupled to the gates of NFET 240 and PFET 246, which also provide inputs of dynamic one-shot circuit 236 and inputs of latching circuit 204.

Also shown in FIG. 2, the input of inverter 248 is coupled to the output of inverter 250 at node 266, which provides latched output 214 of latching circuit 204. Inverters 248 and 250 are configured as cross-coupled inverters for storing one-shot output 262 of dynamic one-shot circuit 236 during evaluation of sensed output 210. The operation of memory sensing and latching circuit 200 is discussed below in relation to timing diagram 300 in FIG. 3.

Figure 3:
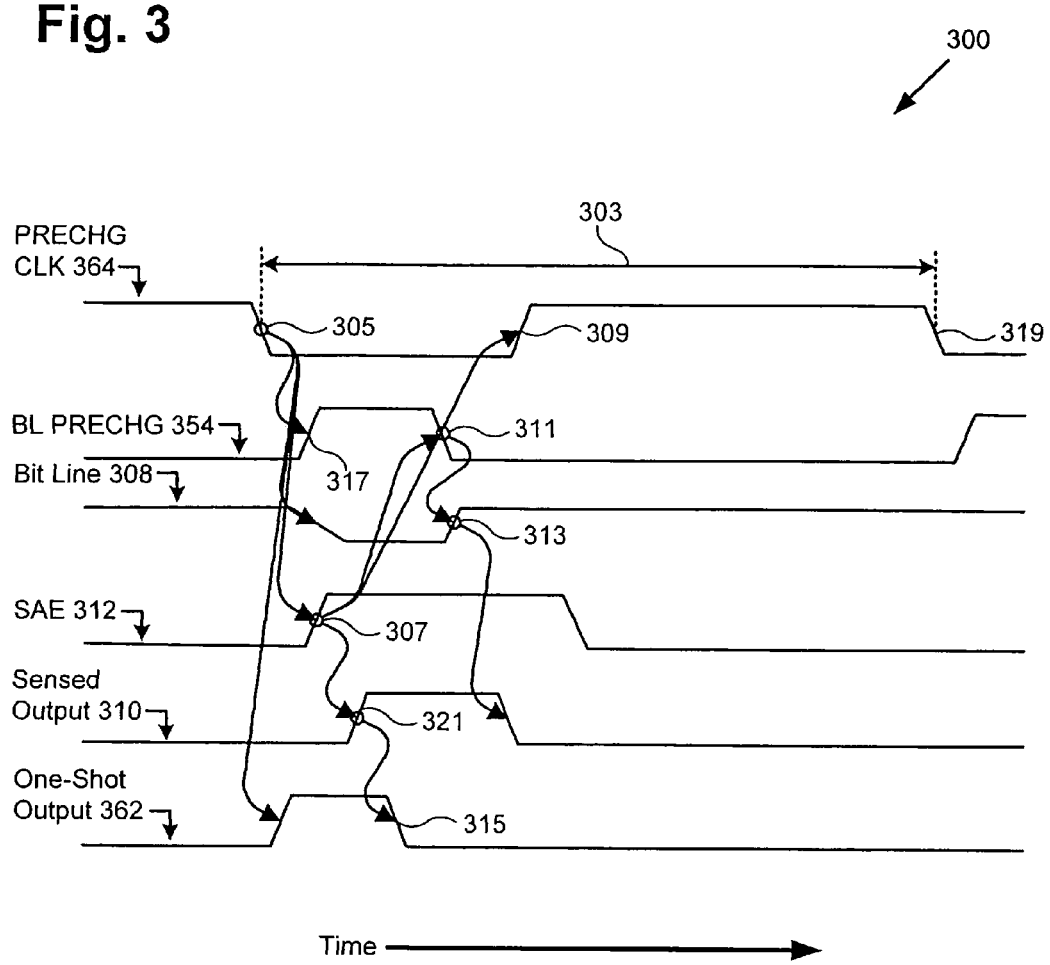
FIG. 3 shows an exemplary timing diagram for the exemplary memory sensing and latching circuit in FIG. 2 in accordance with one embodiment of the present invention.

FIG. 3 shows timing diagram 300 of memory sensing and latching circuit 200 in FIG. 2 in accordance with one embodiment of the present invention. In timing diagram 300, bit line 308, sensed output 310, SAE 312, BL PRECHG 354, one-shot output 362, and PRECHG CLK 364 correspond, respectively, to bit line 208, sensed output 210, SAE 212, BL PRECHG 254, one-shot output 262, and PRECHG CLK 264 in memory sensing and latching circuit 200 in FIG. 2.

The operation of memory sensing and latching circuit 200 in FIG. 2 will now be discussed in relation to timing diagram 300. Memory cycle time 303, which is set by the time required to precharge bit lines, such as bit lines 206 and 208, is measured between successive falling edges 305 and 319 of PRECHG CLK 364. When PRECHG CLK 364 transitions from high-to-low at falling edge 305, SAE 312, which is utilized to enable sensing circuit 202 and latching circuit 204, is at a low voltage level. As a result, SAE 312 turns on PFET 246 and PRECHG CLK 364 turns on PFET 244, which causes one-shot output 362 at node 260 of dynamic one-shot circuit 204 to be precharged to a voltage approximately equal to VDD, i.e., one-shot output 362 is precharged high. Falling edge 305 of PRECHG CLK 364 triggers rising edge 307 of SAE 312 after a delay, and rising edge 307 triggers rising edge 309 of PRECHG CLK 364 after a delay. PRECHG CLK 364 is a complement of a local clock, which can be utilized to generate SAE 312. For example, the local clock can be inputted into a non-inverting buffer, which can comprise, for example, two series-coupled inverters, and SAE 312 can be generated at the output of the non-inverting buffer.

When SAE 312 transitions from low-to-high at rising edge 307, NFET 240 is turned on and PFET 246 is turned off, thereby preventing one-shot output 362 of dynamic one-shot circuit 204 from being precharged by VDD. Thus, one-shot output 362 is in a precharge state between falling edge 305 of PRECHG CLK 364 and rising edge 307 of SAE 312. The transition of SAE 312 from low-to-high causes one-shot output 362 to be in an evaluation state, wherein sensed output 310, which drives the gate of NFET 242, is evaluated. During the evaluation state of one-shot output 362, the logic state of one-shot output 362 that corresponds to sensed output 310 is stored by storage circuit 238 at node 260 and the complement of one-shot output 362 is stored at node 266, which provides latched output 214. The logic state of one-shot output 362 remains stored, i.e., latched, by storage circuit 238 until the next falling edge of PRECHG CLK 364, i.e., falling edge 319. As soon as sensed output 310 transitions from low-to-high at rising edge 321, node 260 is discharged to ground 227 via NFETs 240 and 242, which allows sensed output 310 to transition from high-to-low immediately thereafter.

SAE 312 also enables sensing circuit 202. When SAE 312 transitions from low-to-high, NFET 226 is turned on, which couples ground 227 to ground terminals of inverters 216 and 218, and PFET 228 is turned on, which couples VDD to the supply voltage terminals of inverters 216 and 218, thereby enabling drain-fed cross-coupled inverters 216 and 218, which sense the small signal differential between bit lines 206 and 208. Bit line 206 drives the input of inverter 218 and bit line 208 drives the input of inverter 216 to start bit line sensing. The logic states of bit lines 206 and 208 are held by cross-coupled inverters 216 and 218 at respective nodes 256 and 258 until bit lines 206 and 208 are precharged.

Falling edge 311 of BL PRECHG (bit line precharge signal) 354 is triggered by rising edge 307 of SAE 312 after a delay. When BL PRECHG 354 transitions from high-to-low, PFETS 230, 232, and 234 are turned on to precharge bit lines 206 to 208 to a high voltage level, i.e., to a voltage level approximately equal to VDD. For example, falling edge 311 of BL PRECHG 354 triggers rising edge 313 of bit line 308, which causes bit line 308 to transition from low-to-high. When one-shot output 362 transitions from high-to-low at falling edge 315, the high-to-low transition of one-shot output 362 indicates that sensed output 310 has been evaluated and that a corresponding logic state of one-shot output 362 has been stored in storage circuit 238.

Since falling edge 315 of one-shot output 362 and falling edge 311 of BL

PRECHG 354 are triggered by rising edge 307 of SAE 312 after respective delays, the timing can be adjusted to ensure that one-shot output 362 transitions from high-to-low before BL PRECHG 354 transitions from high-to-low to precharge bit lines 206 and 208. In other words, the timing of falling edge 315 of one-shot output 362 and falling edge 311 can be adjusted such that sensed output 310 of sensing circuit 202 is evaluated and a corresponding logic state of sensed output 310 is stored in storage circuit 238 prior to precharging bit lines 206 and 208. When BL PRECHG 354 transitions from low-to-high at rising edge 317, which is trigged by falling edge 305 of PRECHG CLK 364 after a delay, the memory cell coupled to bit lines 206 and 208 is ready for evaluation.

Thus, in the present invention, a sense amplifier enable signal is utilized to enable a sensing circuit, such as a drain-fed sense amplifier, which is coupled to a memory cell of a memory array via bit lines, and a latching circuit, which includes a dynamic one-shot circuit and a storage circuit for capturing a sensed output of the sensing circuit. By driving the dynamic one-shot circuit by the sensed output, the sense amplifier enable signal, and a precharge clock, the invention's latching circuit can reduce the time required to store the sensed output of the sensing circuit compared to a conventional latching circuit. By precharging the bit lines as soon as the sensed output of the sensing circuit has been stored by the latching circuit, the invention advantageously achieves a reduced memory cycle time compared to a sensing circuit, such as a drain-fed sense amplifier, coupled to a conventional latching circuit.

Also, by utilizing dynamic one-short circuit, the sensed output provided by the sensing circuit only has to be pulsed to discharge the node that provides the one-shot output. As a result, a fast, small-size inverter can be utilized in the sensing circuit to drive the invention's latching circuit, which advantageously reduces the manufacturing cost of the sensing circuit.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a memory sensing and latching circuit has been described.

The invention claimed is:

1. A memory circuit comprising:
a sensing circuit for evaluating bit lines in a memory array and providing a sensed output;
a latching circuit driven by said sensed output, a sense amplifier enable signal, and a precharge clock;
a storage circuit for storing a latching circuit output, said latching circuit output being responsive to said sensed output;
wherein a precharge state of said latching circuit is determined using said precharge clock.

2. The memory circuit of claim 1, wherein said latching circuit comprises a dynamic one-shot circuit.

3. The memory circuit of claim 2, wherein said dynamic one-shot circuit is driven by said sensed output.

4. The memory circuit of claim 2, wherein said dynamic one-shot circuit is driven by said sensed output and said sense amplifier enable signal.

5. The memory circuit of claim 2, wherein said dynamic one-shot circuit is driven by said sensed output, said sense amplifier enable signal, and said precharge clock.

6. The memory circuit of claim 2, wherein said storage circuit stores a one-shot output of said dynamic one-shot circuit, said one-shot output being responsive to said sensed output.

7. The memory circuit of claim 6, wherein said one-shot output is stored in said storage circuit during an evaluation of said sensed output.

8. The memory circuit of claim 7, wherein said evaluation of said sensed output is performed responsive to said sense amplifier enable signal.

9. The memory circuit of claim 1, wherein said sense amplifier enable signal and said precharge clock determine said precharge state of said latching circuit.

10. The memory circuit of claim 1, wherein said sense amplifier enable signal determines a precharge state of said bit lines.

11. The memory circuit of claim 6, wherein said dynamic one-shot circuit comprises first and second PFETs coupled between a supply voltage and said one-shot output, wherein said sense amplifier enable signal is coupled to a gate of said first PFET and said precharge clock is coupled to a gate of said second PFET.

12. The memory circuit of claim 6, wherein said dynamic one-shot circuit comprises first and second NFETs coupled between said one-shot output and a ground, wherein said sensed output is coupled to a gate of said first NFET and said sense amplifier enable signal is coupled to a gate of said second NFET.

13. The memory circuit of claim 1, wherein said sensing circuit comprises a drain-fed sense amplifier.

14. The memory circuit of claim 1, wherein said storage circuit is a part of said latching circuit.

15. A method for evaluating and storing a sensed output of a sensing circuit, said sensing circuit coupled to bit lines in a memory array, said method comprising:
inputting said sensed output, a sense amplifier enable signal, and a precharge clock into a latching circuit;
determining a precharge state of said latching circuit using said precharge clock;
storing a latching circuit output, said latching circuit output being responsive to said sensed output.

16. The method of claim 15 further comprising precharging said bit lines.

17. The method of claim 15, wherein said latching circuit comprises a dynamic one-shot circuit providing a one-shot output, wherein said method comprises evaluating and storing said one-shot output.

18. The method of claim 17 further comprising precharging said one-shot output prior to said step of evaluating and storing said one-shot output.

19. The method of claim 15, wherein said storing is performed responsive to said sense amplifier enable signal.

20. The method of claim 16, wherein said precharging said bit lines is performed responsive to said sense amplifier enable signal.

* * * * *